(12) United States Patent
Ishii

(10) Patent No.: US 8,031,000 B2
(45) Date of Patent: Oct. 4, 2011

(54) DIFFERENTIAL AMPLIFIER, SAMPLE-AND-HOLD CIRCUIT, AND AMPLIFIER CIRCUIT

(75) Inventor: Hirotomo Ishii, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/507,165

(22) Filed: Jul. 22, 2009

(65) Prior Publication Data

US 2010/0052785 A1    Mar. 4, 2010

(30) Foreign Application Priority Data

Sep. 2, 2008    (JP) .................. 2008-224290

(51) Int. Cl.
*H03F 3/45*    (2006.01)
(52) U.S. Cl. ....................... 330/259; 330/258
(58) Field of Classification Search ............... 330/253, 330/258, 260, 259; 327/558
See application file for complete search history.

(56) References Cited

U.S. PATENT DOCUMENTS

| | | | |
|---|---|---|---|
| 6,140,877 A | 10/2000 | Forbes | |
| 6,429,734 B1* | 8/2002 | Wang et al. | 327/558 |
| 6,677,822 B2 | 1/2004 | Hasegawa | |
| 7,005,919 B2* | 2/2006 | Petrovic et al. | 330/149 |
| 7,521,999 B2* | 4/2009 | Kurose et al. | 330/258 |

FOREIGN PATENT DOCUMENTS

| | | |
|---|---|---|
| JP | 10-322143 | 12/1998 |
| JP | 2006-174033 | 6/2006 |

* cited by examiner

*Primary Examiner* — Hieu Nguyen
(74) *Attorney, Agent, or Firm* — Turocy & Watson, LLP

(57) ABSTRACT

To provide a common-mode feedback circuit that feeds back signal corresponding to common-mode components of output terminal voltage of first and second amplifiers to input terminals of the first and second amplifiers via first and second passive elements connected to a common terminal, respectively.

7 Claims, 8 Drawing Sheets

DIFFERENTIAL AMPLIFIER, SAMPLE-AND-HOLD CIRCUIT, AND AMPLIFIER CIRCUIT

CROSS-REFERENCE TO RELATED APPLICATIONS

This application is based upon and claims the benefit of priority from the prior Japanese Patent Application No. 2008-224290, filed on Sep. 2, 2008; the entire contents of which are incorporated herein by reference.

BACKGROUND OF THE INVENTION

1. Field of the Invention

The present invention relates to a differential amplifier, a sample-and-hold circuit, and an amplifier circuit.

2. Description of the Related Art

In a conventional differential amplifier, only one of an input common-mode voltage and an output common-mode voltage of the differential amplifier is controlled to set a direct-current operating point of the differential amplifier. To perform a low-voltage operation of the differential amplifier without narrowing an output voltage range of the differential amplifier, there are methods of operating the differential amplifier as a grounded source amplifier by omitting a current source commonly connected to source sides of transistors constituting a differential pair.

For example, U.S. Pat. No. 6,140,877 discloses a method of controlling an output common-mode voltage by feeding back the output common-mode voltage to a back gate terminal of a signal input MOSFET.

U.S. Pat. No. 6,677,822 discloses a method of controlling an output common-mode voltage by adjusting a bias current of a grounded source amplifier based on the output common-mode voltage.

Japanese Patent Application Laid-open No. 2006-174033 discloses a method of controlling an output common-mode voltage by adjusting a source potential of a grounded source amplifier based on the output common-mode voltage.

Japanese Patent Application Laid-open No. H10-322143 discloses a method of correcting a bias setting of an operating point and a direct-current (DC) offset by performing common-mode negative-feedback control to a fully differential amplifier that is provided by combining a transconductance circuit, a constant gain amplifier, and a capacitor by using these as constituent elements.

However, according to the method disclosed in U.S. Pat. No. 6,140,877, an adjustable range of an output common-mode voltage is only a variable range of a threshold voltage of the MOSFET of a grounded source amplifier due to a back-gate effect. Therefore, this method has a problem that a sufficient adjustable range is not necessarily obtained.

According to the method disclosed in U.S. Pat. No. 6,677,822, transconductance of a transistor changes when a bias current is adjusted. Therefore, this method has a problem that a frequency characteristic of a grounded source amplifier changes, and a desired frequency characteristic cannot be obtained necessarily.

According to the method disclosed in Japanese Patent Application Laid-open No. 2006-174033, a transistor is connected to a source of a grounded source amplifier to adjust a source potential of the grounded source amplifier. Therefore, this method has a problem that an output voltage range becomes narrow corresponding to a voltage drop of the transistor.

According to the method disclosed in Japanese Patent Application Laid-open No. H10-322143, an output common-mode voltage is fed back to a signal input terminal of an amplifier via a transconductance circuit. Therefore, this method has a problem that thermal noise and flicker noise generated in the transconductance circuit are differentially amplified as they are, and a differential noise characteristic is degraded.

BRIEF SUMMARY OF THE INVENTION

A differential amplifier according to an embodiment of the present invention comprises: first and second amplifiers; and a common-mode feedback circuit that feeds back signal corresponding to common-mode components of output terminal voltage of the first and second amplifiers to input terminals of the first and second amplifiers via first and second passive elements connected to a common terminal, respectively.

A sample-and-hold circuit according to an embodiment of the present invention comprises: first and second amplifiers; a common-mode feedback circuit that feeds back signal corresponding to common-mode components of output terminal voltage of the first and second amplifiers to input terminals of the first and second amplifiers via first and second capacitors connected to a common terminal, respectively; a third capacitor having one end thereof connected to the input terminal of the first amplifier; a fourth capacitor having one end thereof connected to the input terminal of the second amplifier; a first switch connected to the other end of the third capacitor; a second switch connected to the other end of the fourth capacitor; a third switch connected between the output terminal of the first amplifier and the other end of the third capacitor; a fourth switch connected between the output terminal of the second amplifier and the other end of the fourth capacitor; a fifth switch connected between the input terminal of the first amplifier and a first reference potential; and a sixth switch connected between the input terminal of the second amplifier and the first reference potential, wherein the common-mode feedback circuit includes a common-mode detection circuit that detects common-mode components of the output terminal voltage of the first and second amplifiers, and a control circuit that outputs to the common terminal a control signal generated based on common-mode components detected by the common-mode detection circuit, and outputs the control signal from the common terminal to the output terminals of the first and second amplifiers via the first and second capacitors, respectively, the common-mode detection circuit includes a fifth capacitor having one end thereof connected to the output terminal of the common-mode detection circuit, a sixth capacitor having one end thereof connected to the output terminal of the common-mode detection circuit, a seventh switch connected between the other end of the fifth capacitor and the output terminal of the first amplifier, an eighth switch connected between the other end of the sixth capacitor and the output terminal of the second amplifier, a ninth switch connected between the other end of the fifth capacitor and a second reference potential, a tenth switch connected between the other end of the sixth capacitor and the second reference potential, and an eleventh switch connected between the output terminal of the common-mode detection circuit and the second reference potential, and the control circuit includes a third amplifier that amplifies a signal of the output terminal of the common-mode detection circuit, and outputs an amplified signal to the common terminal, a twelfth switch connected between the first reference potential and the common terminal, and a thirteenth switch connected between an output terminal of the third amplifier and the common terminal, the first switch, the second switch, the fifth switch, the sixth switch, the ninth switch, the tenth switch, the eleventh switch, and the twelfth switch are turned on and off according to a first pulse signal, and the third switch, the fourth switch, the seventh switch, the eighth switch, and the thirteenth switch are turned on and off according to a second pulse signal.

An amplifier circuit according to an embodiment of the present invention comprises: first and second amplifiers; a common-mode feedback circuit that feeds back signal corresponding to common-mode components of output terminal voltage of the first and second amplifiers to input terminals of the first and second amplifiers via first and second resistors connected to a common terminal, respectively; a third resistor connected to the input terminal of the first amplifier; a fourth resistor connected to the input terminal of the second amplifier; a fifth resistor connected between the input terminal of the first amplifier and the output terminal of the first amplifier; and a sixth resistor connected between the input terminal of the second amplifier and the output terminal of the second amplifier, wherein the common-mode feedback circuit includes a common-mode detection circuit that detects common-mode components of the output terminal voltage of the first and second amplifiers, and a control circuit that outputs to the common terminal a control signal generated based on common-mode components detected by the common-mode detection circuit, and outputs the control signal from the common terminal to the output terminals of the first and second amplifiers via the first and second resistors, respectively, the common-mode detection circuit includes a seventh resistor connected between the output terminal of the first amplifier and an output terminal of the common-mode detection circuit, and an eighth resistor connected between the output terminal of the second amplifier and the output terminal of the common-mode detection circuit, and the control circuit includes a third amplifier that amplifies a signal of the output terminal of the common-mode detection circuit, and outputs an amplified signal to the common terminal.

DETAILED DESCRIPTION OF THE INVENTION

Exemplary embodiments of a differential amplifier according to the present invention will be explained below in detail with reference to the accompanying drawings. The present invention is not limited the embodiments.

Figure 1:
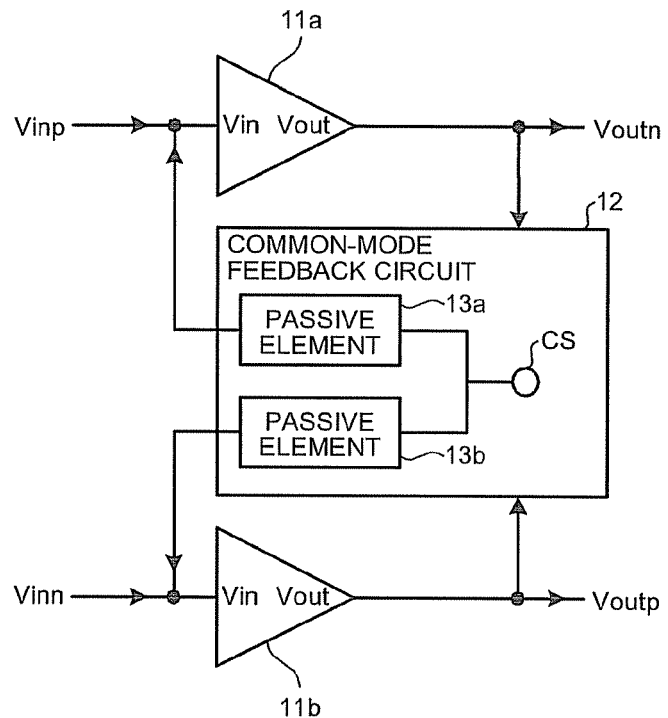
FIG. 1 is a block diagram of a schematic configuration of a differential amplifier according to a first embodiment of the present invention.

FIG. 1 is a block diagram of a schematic configuration of a differential amplifier according to a first embodiment of the present invention.

In FIG. 1, the differential amplifier includes amplifiers 11a and 11b and a common-mode feedback circuit 12. The amplifiers 11a and 11b can be configured by single-ended (one input and one output) inverted amplifiers. The common-mode feedback circuit 12 can feedback signal corresponding to common-mode components of output terminal voltage of the amplifiers 11a and 11b to input terminals of the amplifiers 11a and 11b. The common-mode feedback circuit 12 includes passive elements 13a and 13b. The passive elements 13a and 13b are connected to a common terminal CS. The common-mode feedback circuit 12 can feedback signal corresponding to the common-mode components of the output terminal voltage of the amplifiers 11a and 11b from the common terminal CS to the input terminals of the amplifiers 11a and 11b via the passive elements 13a and 13b, respectively. Resistors or capacitors can be used for the passive elements 13a and 13b.

When input voltages Vinp and Vinn are input to the amplifiers 11a and 11b, respectively, the input voltages Vinp and Vinn are inversion amplified, respectively, and output voltages Voutp and Voutn are output from the amplifiers 11a and 11b, respectively. The output voltages Voutp and Voutn output from the amplifiers 11a and 11b, respectively are input to the common-mode feedback circuit 12, and common-mode components of the output voltages Voutp and Voutn of the amplifiers 11a and 11b are detected. When the common-mode feedback circuit 12 detects the common-mode components of the output voltages Voutp and Voutn of the amplifiers 11a and 11b, the common-mode components are fed back from the common terminal CS to the input terminals of the amplifiers 11a and 11b via the passive elements 13a and 13b, respectively.

The common-mode feedback circuit 12 feeds back signal corresponding to the common-mode components of the output voltages Voutp and Voutn without inverting the phases. As a result, in the circuit shown in FIG. 1, a negative feedback circuit corresponding to the common-mode components of the output voltages Voutp and Voutn is configured. The common-mode feedback circuit 12 feeds back signal corresponding to the common-mode components of the output voltages Voutp and Voutn output from the amplifiers 11a and 11b, respectively to the input terminals of the amplifiers 11a and 11b. With this arrangement, the common-mode feedback circuit 12 can set a direct-current operating point of the differential amplifier while controlling both the input common-mode voltage and the output common-mode voltage of the differential amplifier. Therefore, as compared to the method of setting a direct-current operating point of the differential amplifier while controlling only one of the input common-mode voltage and the output common-mode voltage of the differential amplifier, operation margin given to the circuit can be reduced to obtain tolerance to the common-mode voltage equivalent to the conventional tolerance. Further, the ratio of an output voltage range to the power source voltage can be increased while suppressing the increase of power consumption.

By feeding back the common-mode components of the output terminal voltage of the amplifiers 11a and 11b to the input terminals of the amplifiers 11a and 11b via the passive elements 13a and 13b connected to the common terminal CS, respectively, feedback of thermal noise and flicker noise generated in the common-mode feedback circuit 12 as differential components can be prevented, and degradation of a differential noise characteristic can be suppressed. Further, the common-mode components can be controlled without changing the frequency characteristics of the amplifiers 11a and 11b, unlike the procedure of the invention disclosed in U.S. Pat. No. 6,677,822. The differential amplifier can operate stably without causing the frequency characteristic of the differential amplifier to be changed due to the common-mode components of the input signals.

In the above explanations of the first embodiment, the amplifiers 11a and 11b operate as the inverted amplifiers. However, the invention can be also applied to a case that the amplifiers 11a and 11b operate as non-inverted amplifiers. In this case, a circuit that inverts a phase can be used for the common-mode feedback circuit 12.

Figure 2:
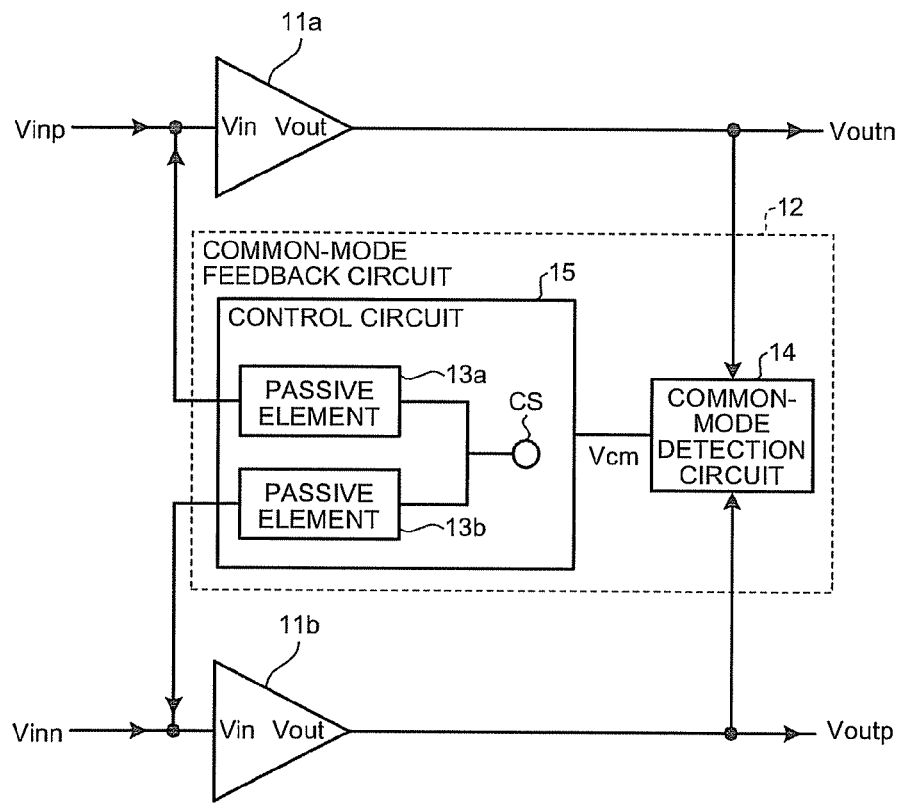
FIG. 2 is a block diagram of a schematic configuration of a differential amplifier according to a second embodiment of the present invention.

FIG. 2 is a block diagram of a schematic configuration of a differential amplifier according to a second embodiment of the present invention.

In FIG. 2, the common-mode feedback circuit 12 shown in FIG. 1 includes a common-mode detection circuit 14 and a control circuit 15. The common-mode detection circuit 14 detects common-mode components of output terminal voltage of the amplifiers 11a and 11b, and can output a common-mode signal Vcm corresponding to the common-mode components. The control circuit 15 can output to the common terminal CS a control signal generated based on the common-mode components detected by the common-mode detection circuit 14, and output a control signal to the output terminals of the amplifiers 11a and 11b via the passive elements 13a and 13b from the common terminal CS, respectively.

When the input voltages Vinp and Vinn are input to the amplifiers 11a and 11b, respectively, the input voltages Vinp and Vinn are inversion amplified, respectively, and the output voltages Voutp and Voutn are output from the amplifiers 11a and 11b, respectively. The output voltages Voutp and Voutn output from the amplifiers 11a and 11b, respectively are input to the common-mode detection circuit 14, and common-mode components of the output voltages Voutp and Voutn of the amplifiers 11a and 11b are detected. The common-mode signal Vcm corresponding to the common-mode components is output to the control circuit 15. The control circuit 15 generates based on the common-mode signal Vcm a control signal for applying a negative feedback to the common-mode components of the output voltages Voutp and Voutn, and outputs the control signal to the common terminal CS. The control signal output to the common terminal CS is fed back to the input terminals of the amplifiers 11a and 11b via the passive elements 13a and 13b.

Figure 3A:
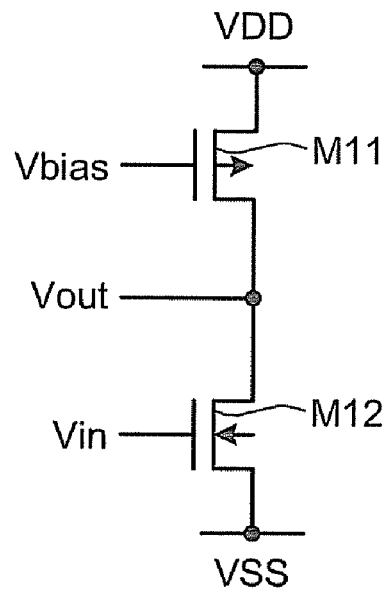
FIG. 3A is an example of a circuit configuration of the amplifier shown in FIG. 2.

FIG. 3A is an example of a circuit configuration of the amplifiers 11a and 11b shown in FIG. 2.

In FIG. 3A, the amplifier 11a includes field-effect transistors M11 and M12. The field-effect transistors M11 and M12 are connected in series with each other. A P-channel type can be used for the field-effect transistor M11, and an N-channel type can be used for the field-effect transistor M12. A source of the field-effect transistor M11 is connected to a high power-source potential VDD, and a source of the field-effect transistor M12 is connected to a low power-source potential VSS.

When a bias voltage Vbias is applied to a gate of the field-effect transistor M11, the field-effect transistor M11 can operate as a constant current source. When an input voltage Vin is applied to a gate of the field-effect transistor M12, the input voltage Vin is amplified by the field-effect transistor M12, and an output voltage Vout is output from a drain of the field-effect transistor M12. The amplifier 11b can also have a configuration similar to that of the amplifier 11a.

Figure 3B:
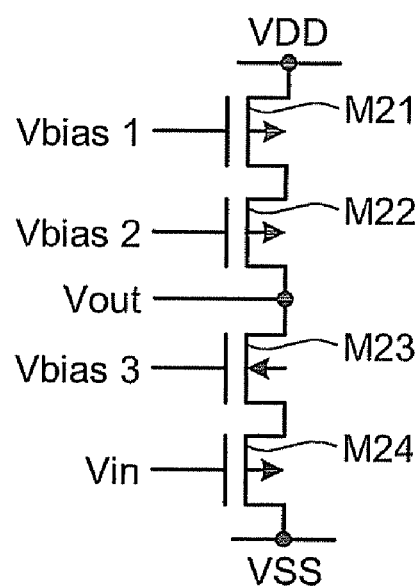
FIG. 3B is another example of a circuit configuration the amplifier shown in FIG. 2.

FIG. 3B is another example of a circuit configuration of the amplifiers 11a and 11b shown in FIG. 2.

In FIG. 3B, the amplifier 11a includes field-effect transistors M21 to M24. The field-effect transistors M21 to M24 are sequentially connected in series with each other. A P-channel type can be used for the field-effect transistors M21 and M22, and an N-channel type can be used for the field-effect transistors M23 and M24. A source of the field-effect transistor M21 is connected to the high power-source potential VDD, and a source of the field-effect transistor M24 is connected to the low power-source potential VSS.

Bias voltages Vbias1 to Vbias3 are applied to gates of the field-effect transistors M21 to M23, respectively. The field-effect transistor M21 operates as a constant current source. When the input voltage Vin is applied to a gate of the field-effect transistor M24, the input voltage Vin is amplified by the field-effect transistor M24, and the output voltage Vout is output from a drain of the field-effect transistor M23. The amplifier 11b can also have a configuration similar to that of the amplifier 11a.

When the amplifiers 11a and 11b use the configuration shown in FIG. 3B, the amplifiers 11a and 11b can increase gain as compared to gain obtained by using the configuration shown in FIG. 3A. The amplifiers 11a and 11b can use grounded source circuits of a P-channel metal-oxide semiconductor (PMOS) input, in addition to the configurations shown in FIG. 3A and FIG. 3B, or can use other grounded source circuits of a configuration having an increased number of stages of a cascade, or a configuration for driving a gate of a cascade element by an amplifier using a source voltage of the cascade element as an input. The amplifiers 11a and 11b can use any circuits capable of obtaining an amplified signal of a single input signal in any configuration.

Figure 4A:
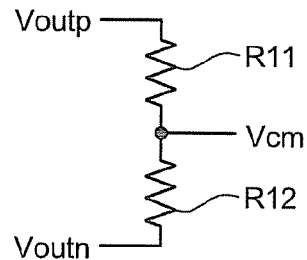
FIG. 4A is an example of a circuit configuration of a common-mode detection circuit shown in FIG. 2.

FIG. 4A is an example of a circuit configuration of the common-mode detection circuit 14 shown in FIG. 2.

In FIG. 4A, the common-mode detection circuit 14 includes resistors R11 and R12. The resistors R11 and R12 are connected in series with each other. The resistors R11 and R12 can be set to have mutually the same values. Series circuits of the resistors R11 and R12 can be connected between the output terminals of the amplifiers 11a and 11b shown in FIG. 2, and a connection point between the resistors R11 and R12 can be connected to an input terminal of the control circuit 15.

When the output voltages Voutp and Voutn of the amplifiers 11a and 11b are applied to both ends of the series circuits of the resistors R11 and R12, respectively, the common-mode signal Vcm corresponding to the common-mode components of the output voltages Voutp and Voutn is output from the connection point between the resistors R11 and R12.

Figure 4B:
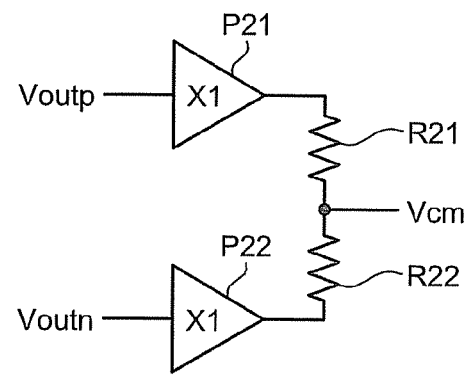
FIG. 4B is another example of a circuit configuration of the common-mode detection circuit shown in FIG. 2.

FIG. 4B is another example of a circuit configuration of the common-mode detection circuit 14 shown in FIG. 2.

In FIG. 4B, the common-mode detection circuit 14 includes the resistors R21 and R22 and buffers P21 and P22. The resistors R21 and R22 are connected in series with each other. The characteristic of buffers P21 and P22 can be set to have mutually the same values. The series circuits of the resistors R21 and R22 can be connected between the output terminals of the amplifiers 11a and 11b shown in FIG. 2 via the buffers P21 and P22, respectively, and a connection point between the resistors R21 and R22 can be connected to the input terminal of the control circuit 15.

The output voltages Voutp and Voutn output from the amplifiers 11a and 11b can be applied to both ends of the series circuits of the resistors R21 and R22 via the buffers P21 and P22, respectively. When the output voltages Voutp and Voutn output from the amplifiers 11a and 11b are applied to both ends of the series circuits of the resistors R21 and R22, the common-mode signal Vcm corresponding to the common-mode components of the output voltages Voutp and Voutn is output from the connection point between the resistors R21 and R22.

When the buffers P21 and P22 are provided in the common-mode detection circuit 14, decrease of load impedance of the amplifiers 11a and 11b can be suppressed even when the common-mode detection circuit 14 is connected to the output terminals of the amplifiers 11a and 11b shown in FIG. 2.

Figure 4C:
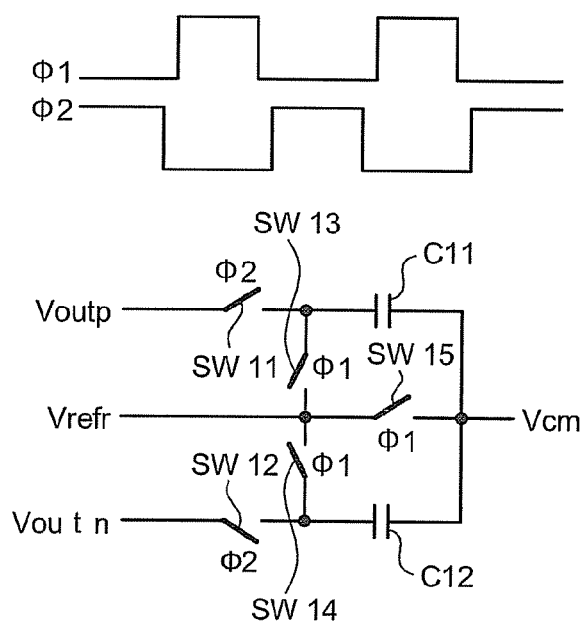
FIG. 4C is still another example of a circuit configuration of the common-mode detection circuit shown in FIG. 2.

FIG. 4C is still another example of a circuit configuration of the common-mode detection circuit 14 shown in FIG. 2.

In FIG. 4C, the common-mode detection circuit 14 includes capacitors C11 and C12 and switches SW11 to SW15. The capacitors C11 and C12 can be set to have mutually the same values. One end of the capacitor C11 can be connected to the input terminal of the control circuit 15, and can be also connected to a reference potential Vrefr via the switch SW15. The other end of the capacitor C11 can be connected to the output terminal of the amplifier 11b via the switch SW11, and can be also connected to the reference potential Vrefr via the switch SW13. One end of the capacitor C12 can be connected to the input terminal of the control circuit 15, and can be also connected to the reference potential Vrefr via the switch SW15. The other end of the capacitor C12 can be connected to the output terminal of the amplifier 11a via the switch SW12, and can be also connected to the reference potential Vrefr via the switch SW14.

The switches SW13 to SW15 can be turned on and off according to a pulse signal Φ1, and the switches SW11 and SW12 can be on and off according to a pulse signal Φ2. Signals of which levels are inverted to each other can be used for the pulse signals Φ1 and Φ2. A dead time can be provided so that the switches SW11 to SW12 and the switches SW13 to SW15 are not turned on simultaneously.

When the pulse signal Φ1 becomes high and also when the pulse signal Φ2 becomes low, the switches SW13 to SW15 are turned on, the switches SW11 and SW12 are turned off, and both ends of the capacitors C11 and C12 are connected to the reference potential Vrefr. As a result, charges accumulated in the capacitors C11 and C12 are initialized. When the pulse signal Φ1 becomes low and also when the pulse signal Φ2 becomes high, the switches SW13 to SW15 are turned off, the switches SW11 and SW12 are turned on, and the output voltages Voutp and Voutn output from the amplifiers 11a and 11b, respectively are applied to the capacitors C11 and C12, respectively. As a result, the common-mode signal Vcm corresponding to the common-mode components of the output voltages Voutp and Voutn is output from the connection point between the capacitors C11 and C12.

Figure 5A:
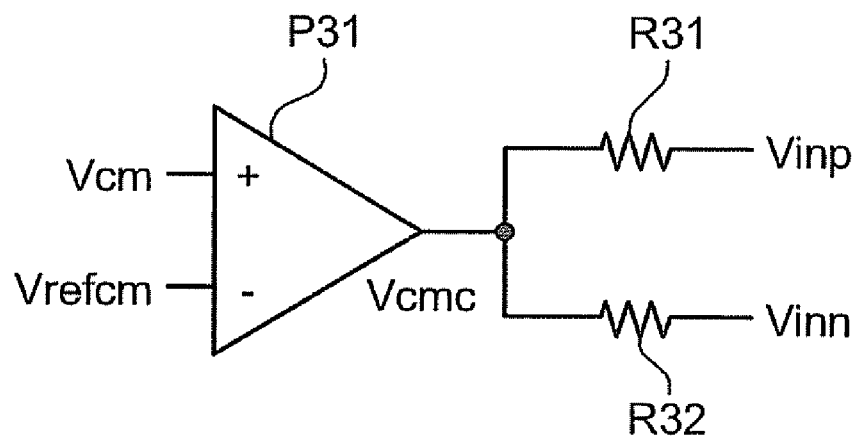
FIG. 5A is an example of a circuit configuration of a control circuit shown in FIG. 2.

FIG. 5A is an example of a circuit configuration of the control circuit 15 shown in FIG. 2.

In FIG. 5A, the control circuit 15 includes resistors R31 and R32 and an amplifier P31. The resistors R31 and R32 can be set to have mutually the same values. The resistors R31 and R32 can be used as the passive elements 13a and 13b shown in FIG. 2. A positive-side input terminal of the amplifier P31 can be connected to the output terminal of the common-mode detection circuit 14 shown in FIG. 2, and a negative-side input terminal of the amplifier P31 can be connected to a reference potential Vrefcm. An output terminal of the amplifier P31 can be connected to one end of each of the resistors R31 and R32. The other end of each of the resistors R31 and R32 can be connected to the input terminals of the amplifiers 11a and 11b, respectively.

When the common-mode signal Vcm is input from the common-mode detection circuit 14 to the positive-side input terminal of the amplifier P31, the amplifier P31 amplifies a difference between the common-mode signal Vcm and the reference potential Vrefcm, and outputs a signal Vcmc obtained by amplifying the difference between the common-mode signal Vcm and the reference potential Vrefcm. The signal Vcmc output from the amplifier P31 is fed back to the input terminals of the amplifiers 11a and 11b via the resistors R31 and R32, respectively.

Figure 5B:
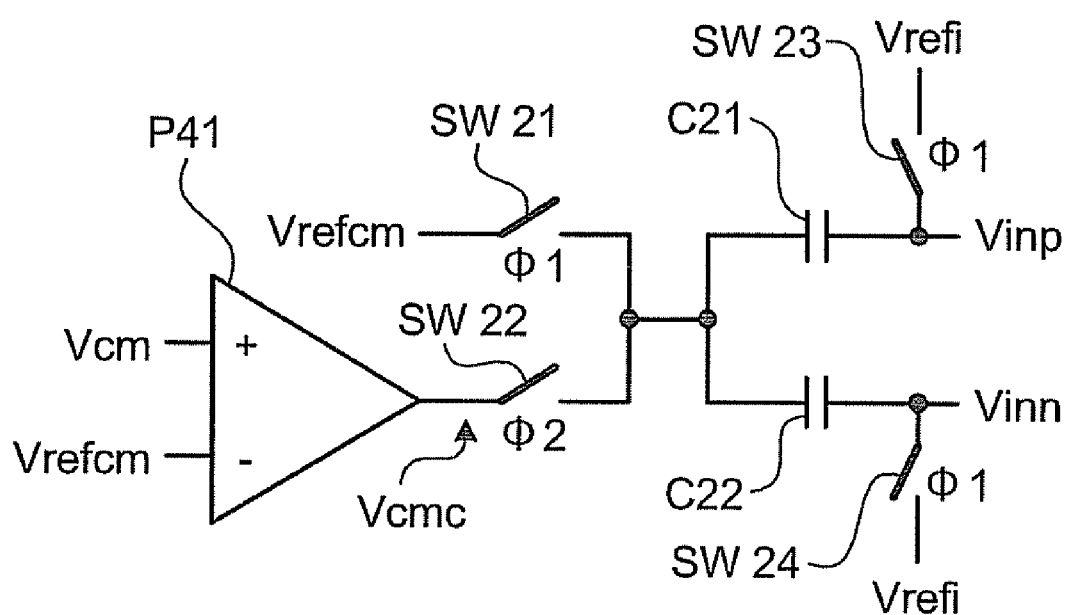
FIG. 5B is another example of a circuit configuration of the control circuit shown in FIG. 2.

FIG. 5B is another example of a circuit configuration of the control circuit 15 shown in FIG. 2.

In FIG. 5B, the control circuit 15 includes capacitors C21 and C22, switches SW21 to SW24, and an amplifier P41. The capacitors C21 and C22 can be set to have mutually the same values. The capacitors C21 and C22 can be used as the passive elements 13a and 13b shown in FIG. 2. A positive-side input terminal of the amplifier P41 can be connected to the output terminal of the common-mode detection circuit 14 shown in FIG. 2, and a negative-side input terminal of the amplifier P41 can be connected to the reference potential Vrefcm. One end of each of the capacitors C21 and C22 can be connected to an output terminal of the amplifier P41 via the switch SW22, and can be also connected to the reference potential Vrefcm via the switch SW21. The other end of the capacitor C21 can be connected to the input terminal of the amplifier 11a, and can be also connected to a reference potential Vrefi via the switch SW23. The other end of the capacitor C22 can be connected to the input terminal of the amplifier 11b, and can be also connected to the reference potential Vrefi via the switch SW24.

The switches SW21, SW23, and SW24 can be turned on and off according to the pulse signal Φ1, and the switch SW22 can be turned on and off according to the pulse signal Φ2.

When the pulse signal Φ1 becomes high and also when the pulse signal Φ2 becomes low, the switches SW21, SW23, and SW24 are turned on, the switch SW22 is turned off, one end of each of the capacitors C21 and C22 is connected to the reference potential Vrefcm, and the other end of each of the capacitors C21 and C22 is connected to the reference potential Vrefi. As a result, charges accumulated in the capacitors C21 and C22 are initialized. When the pulse signal Φ1 becomes low and also when the pulse signal Φ2 becomes high, the switches SW21, SW23, and SW24 are turned off, the switch SW22 is turned on, and the common-mode signal Vcm is input from the common-mode detection circuit 14 shown in FIG. 2 to the positive-side input terminal of the amplifier P41. When the common-mode signal Vcm is input to the positive-side input terminal of the amplifier P41, the amplifier P41 amplifies a difference between the common-mode signal Vcm and the reference potential Vrefcm, and outputs the signal Vcmc obtained by amplifying the difference between the common-mode signal Vcm and the reference potential Vrefcm. The signal Vcmc output from the amplifier P41 is fed back to the input terminals of the amplifiers 11a and 11b via the capacitors C21 and C22, respectively.

Figure 6:
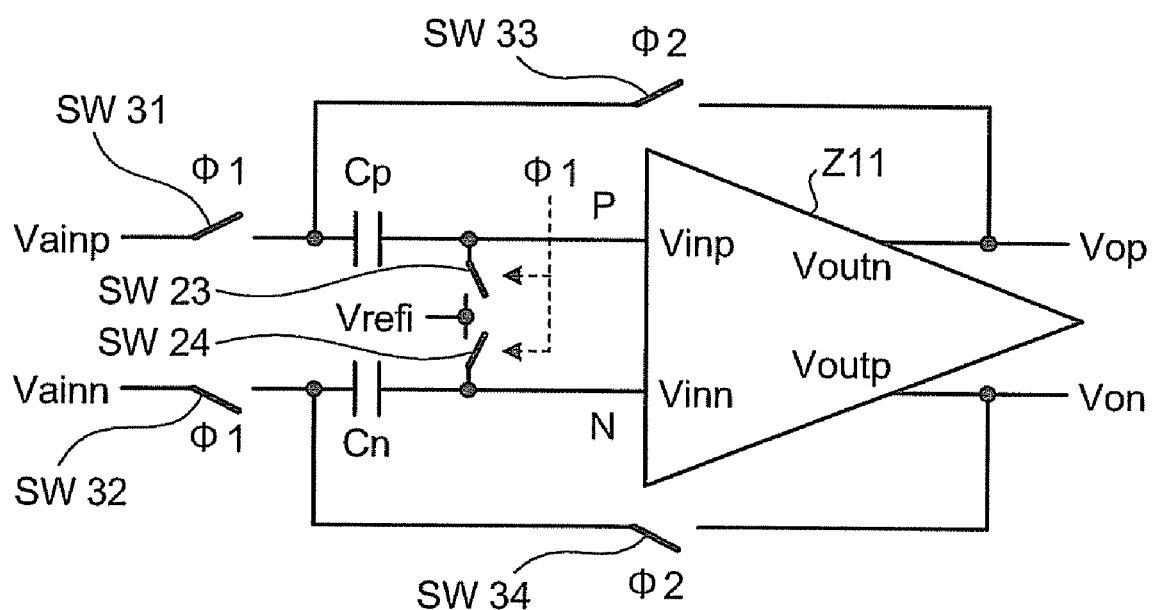
FIG. 6 depicts a schematic configuration of a sample-and-hold circuit to which a differential amplifier according to a third embodiment of the present invention is applied.
Figure 7:
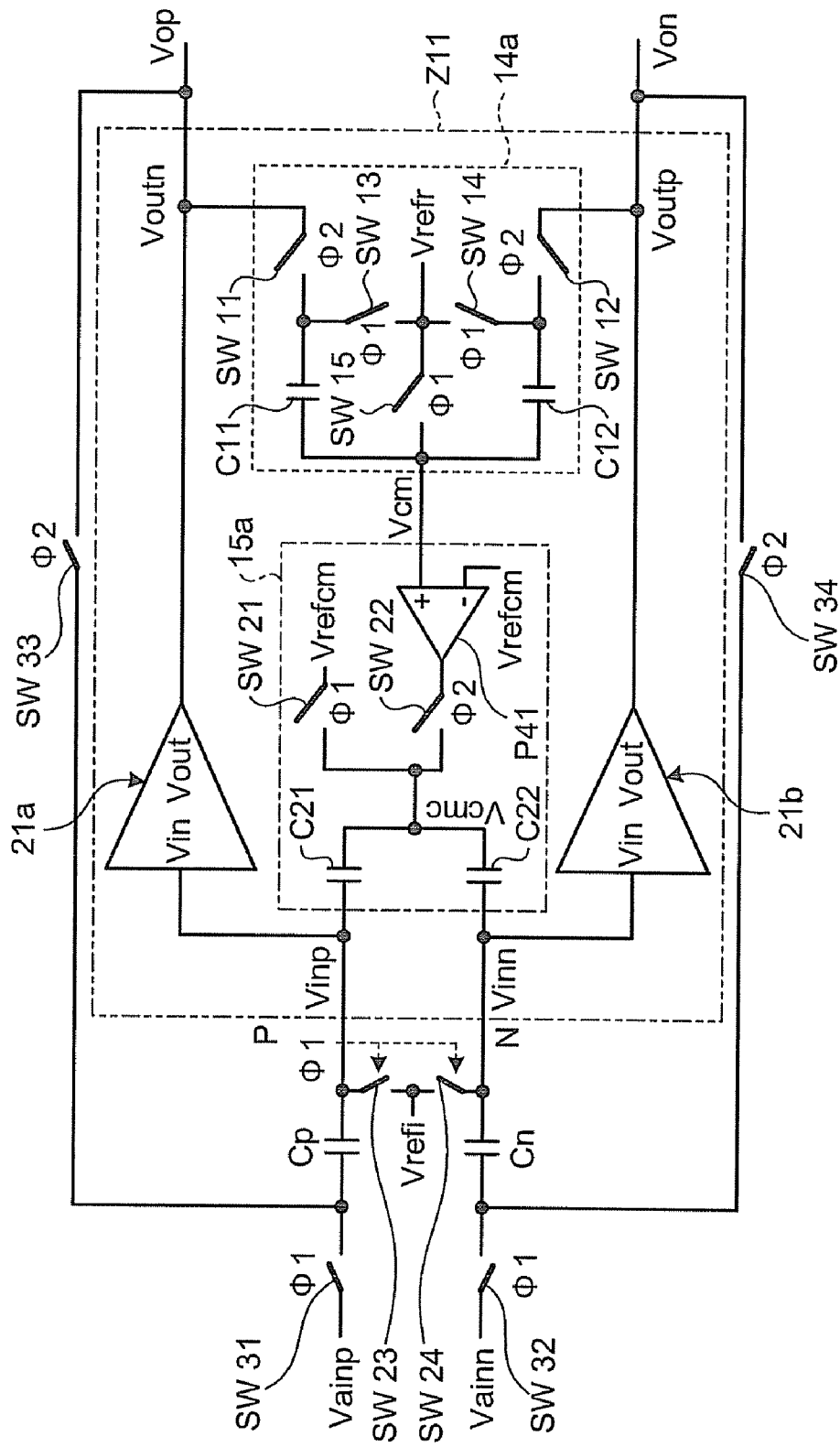
FIG. 7 is an example of a circuit configuration of the sample-and-hold circuit shown in FIG. 6.

FIG. 6 depicts a schematic configuration of a sample-and-hold circuit to which a differential amplifier according to a third embodiment of the present invention is applied. FIG. 7 is an example of a circuit configuration of the sample-and-hold circuit shown in FIG. 6.

In FIG. 6, the sample-and-hold circuit includes a differential amplifier Z11, switches SW23, SW24, and SW31 to SW34, and capacitors Cp and Cn. As shown in FIG. 7, the differential amplifier Z11 includes amplifiers 21a and 21b, a common-mode detection circuit 14a, and a control circuit 15a. A configuration shown in FIG. 4C is used for the common-mode detection circuit 14a, and a configuration shown in FIG. 5B is used for the control circuit 15a.

One end of the capacitor Cp is connected to the switch SW31, and is also connected to an output terminal of the amplifier 21a via the switch SW33. The other end of the capacitor Cp is connected to an input terminal of the amplifier 21a, and is also connected to the reference potential Vrefi via the switch SW23. One end of the capacitor Cn is connected to the switch SW32, and is also connected to an output terminal of the amplifier 21b via the switch SW34. The other end of the capacitor Cn is connected to an input terminal of the amplifier 21b, and is also connected to the reference potential Vrefi via the switch SW24.

When the pulse signal Φ1 becomes high and also when the pulse signal Φ2 becomes low, the switches SW13 to SW15, SW21, SW23, SW24, SW31, and SW32 are turned on, and the switches SW11, SW12, SW22, SW33, and SW34 are turned off. Input voltages Vainp and Vainn are then applied to one end of each of the capacitors Cp and Cn, respectively, and the reference potential Vrefi is applied to the other end of each of the capacitors Cp and Cn, respectively. A voltage of Vainp-Vrefi is sampled in the capacitor Cp, and a voltage of Vainn-Vrefi is sampled in the capacitor Cn.

When the pulse signal Φ1 becomes high and also when the pulse signal Φ2 becomes low, the reference potential Vrefr is connected to both ends of the capacitors C11 and C12, respectively, and charges accumulated in the capacitors C11 and C12 are initialized. The reference potential Vrefcm is connected to one end of each of the capacitors C21 and C22, respectively, the reference potential Vrefi is connected to the other end of each of the capacitors C21 and C22, respectively, and charges accumulated in the capacitors C21 and C22 are initialized.

When the pulse signal Φ1 becomes low and also when the pulse signal Φ2 becomes high, the switches SW13 to SW15, SW21, SW23, SW24, SW31, and SW32 are turned off, and the switches SW11, SW12, SW22, SW33, and SW34 are turned on. The capacitor Cp is then connected between an input terminal and an output terminal of the amplifier 21a, the capacitor Cp holds the voltage of Vainp-Vrefi, the capacitor Cn is connected between an input terminal and an output terminal of the amplifier 21b, and the capacitor Cn holds the voltage of Vainn-Vrefi.

When the pulse signal Φ1 becomes low and also when the pulse signal Φ2 becomes high, the output voltages Voutp and Voutn output from the amplifiers 21a and 21b, respectively are applied to the capacitors C11 and C12, respectively, and the common-mode signal Vcm corresponding to the common-mode components of the output voltage Voutp and Voutn is input to the positive-side input terminal of the amplifier P41 via the connection point between the capacitors C11 and C12. When the common-mode signal Vcm is input to the positive-side input terminal of the amplifier P41, the amplifier P41 amplifies a difference between the common-mode signal Vcm and the reference potential Vrefcm, and outputs the signal Vcmc obtained by amplifying the difference between the common-mode signal Vcm and the reference potential Vrefcm. The signal Vcmc output from the amplifier P41 is fed back to the input terminals of the amplifiers 21a and 21b via the capacitors C21 and C22, respectively. The output voltages Voutp and Voutn output from the amplifiers 21a and 21b, respectively are output as output voltages Von and Vop of the sample-and-hold circuit, respectively.

A common-mode voltage Voutcm and a differential voltage Voutdm of the output voltages Voutp and Voutn output from the amplifiers 21a and 21b, respectively can be calculated as follows.

To calculate the common-mode voltage Voutcm and the differential voltage Voutdm, the following assumption is made.

$$Cn=Cp=Cs$$

$$Cnc=Cpc=Cc$$

In the above equations, Cn and Cp represent capacitances of the capacitors Cn and Cp, respectively, and Cnc and Cpc represent capacitances of the capacitors C22 and C21, respectively.

A common-mode voltage of the input voltages Vainp and Vainn is defined as Vaincm=(Vainp+Vainn)/2, and a differential voltage of the input voltages Vainp and Vainn is defined as Vaindm=(Vainp-Vainn)/2.

A common-mode voltage of the output voltages Vop and Von is defined as Voutcm=(Vop+Von)/2, and a differential voltage of the output voltages Vop and Von is defined as Voutdm=(Vop-Von)/2.

The input voltages Vainp and Vainn of the differential amplifier Z11 can be regarded as the same constant values when a mismatch of element characteristics is disregarded and also when gains of the amplifiers 21a and 21b are assumed to be sufficiently large. Therefore, Vinp=Vinn=Vin is established.

When total charge amounts charged to nodes P and N are Qps and Qns at a sampling time ($\phi 1$=high, $\phi 2$=low), respectively, the total charge amounts Qps and Qns are given by the following equations.

$$Qps=Cs(Vrefi-Vainp)+Cc(Vrefi-Vrefcm)$$

$$Qns=Cs(Vrefi-Vainn)+Cc(Vrefi-Vrefcm)$$

When total charge amounts charged to the nodes P and N are Qph and Qnh at a holding time ($\phi 1$=low, $\phi 2$=high), respectively, the total charge amounts Qph and Qnh are given by the following equations.

$$Qph=Cs(Vin-Vop)+Cc(Vin-Vcmc)$$

$$Qnh=Cs(Vin-Von)+Cc(Vin-Vcmc)$$

When a state shifts from a sampling time to a holding time (shifts from $\phi 1$=high, $\phi 2$=low to $\phi 1$=low, $\phi 2$=high), the following relationship is established based on the charge conservation law.

$$Qps=Qph$$

$$Qns=Qnh$$

As a result, the common-mode voltage Voutcm and the differential voltage Voutdm can be given by the following equations (1-1) and (1-2).

$$Voutcm=Vaincm+(Vin-Vrefi)+Cc/Cs\times[(Vin-Vrefi)-(Vcmc-Vrefcm)] \quad (1\text{-}1)$$

$$Voutdm=Vaindm \quad (1\text{-}2)$$

From the equation (1-2), it is clear that the differential voltage Voutdm of the output of the differential amplifier Z11 is equal to the differential voltage Vaindm of the input.

A value of a first term and a value of a second term of the equation (1-1) cannot be controlled by the differential amplifier Z11. However, only Vcmc of a third term of the equation (1-1) is in a negative feedback loop of the differential amplifier Z11, and is negative feedback controlled. Therefore, the common-mode voltage Voutcm can be controlled to a desired value without giving influence to the differential voltage Voutdm. When a proper ratio is applied to the values of Cs and Cc, for example, a value of Voutcm can be set to a predetermined value regardless of a value of Vaincm, and thus there is no limitation of an adjustment range of the output common-mode voltage in principle.

Figure 8:
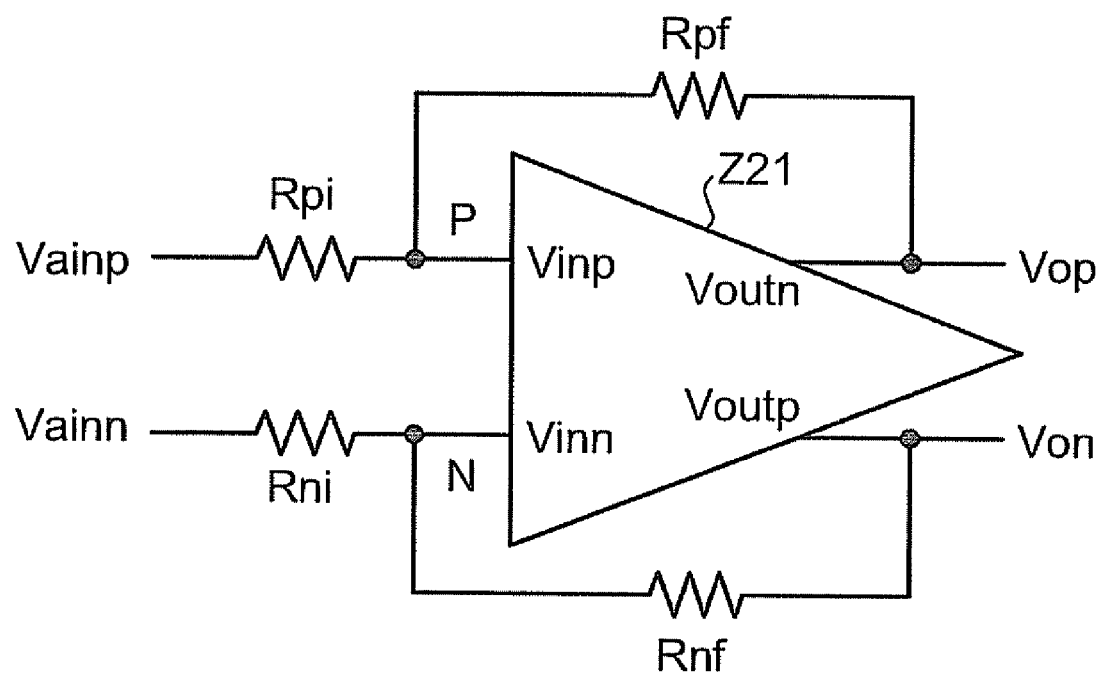
FIG. 8 depicts a schematic configuration of an amplifier circuit to which a differential amplifier according to a fourth embodiment of the present invention is applied.
Figure 9:
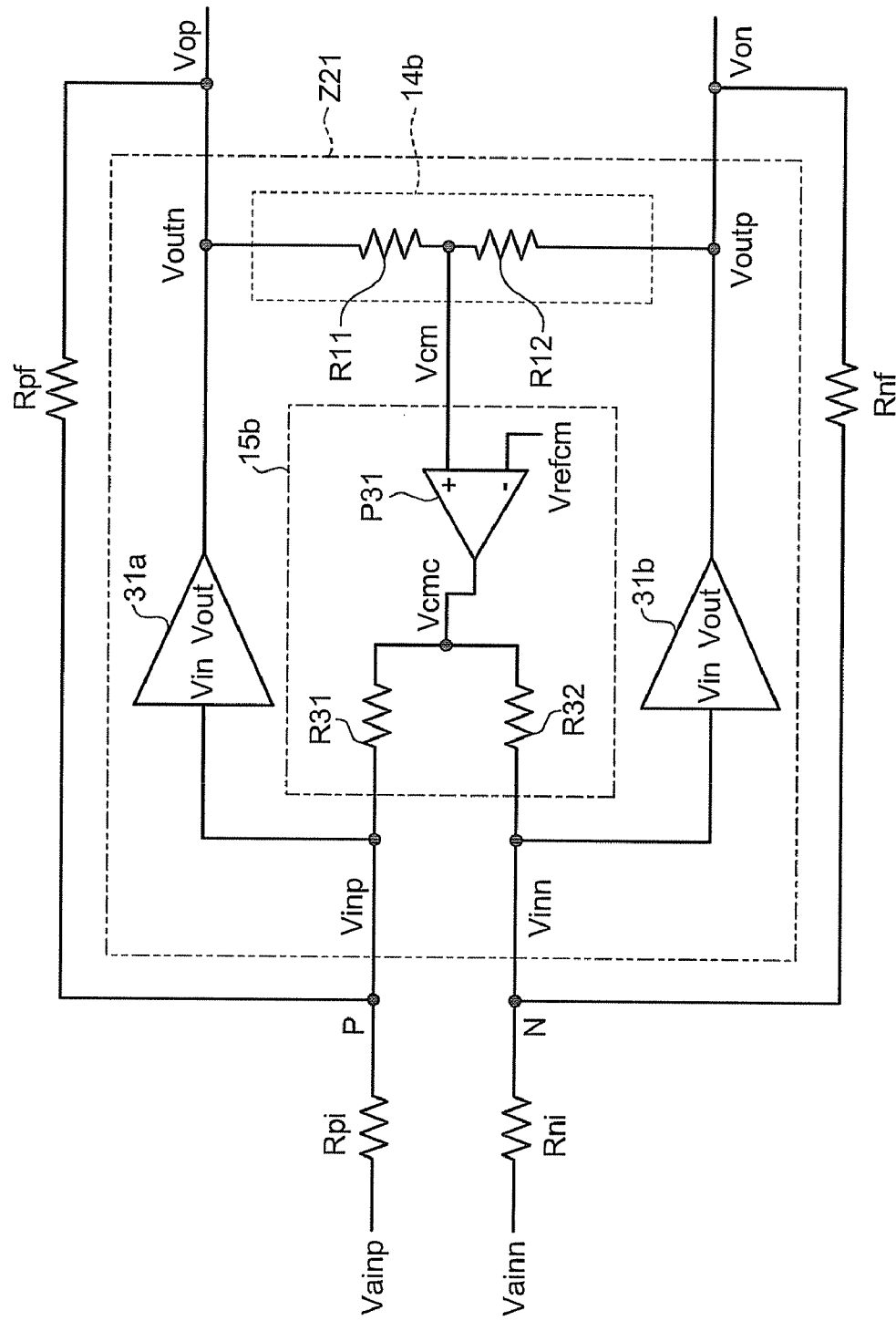
FIG. 9 is an example of a circuit configuration of the amplifier circuit shown in FIG. 8.

FIG. 8 depicts a schematic configuration of an amplifier circuit to which a differential amplifier according to a fourth embodiment of the present invention is applied. FIG. 9 is an example of a circuit configuration of the amplifier circuit shown in FIG. 8.

In FIG. 8, the amplifier circuit includes a differential amplifier Z21, and resistors Rpi, Rni, Rpf, and Rnf. As shown in FIG. 9, the differential amplifier Z21 includes amplifiers 31a and 31b, a common-mode detection circuit 14b, and a control circuit 15b. A configuration shown in FIG. 4A is used for the common-mode detection circuit 14b, and a configuration shown in FIG. 5A is used for the control circuit 15b. Instead of the configuration shown in FIG. 4A, a configuration shown in FIG. 4B can be used for the common-mode detection circuit 14b.

One end of the resistor Rpi is connected to an input terminal of the amplifier 31a, and the resistor Rpf is connected between the input terminal and an output terminal of the amplifier 31a. One end of the resistor Rni is connected to an input terminal of the amplifier 31b, and the resistor Rnf is connected between the input terminal and an output terminal of the amplifier 31b.

The input voltages Vainp and Vainn are applied to the input terminals of the amplifiers 31a and 31b, respectively via the resistors Rpi and Rni, respectively. The output voltages Voutn and Voutp output from the amplifiers 31a and 31b, respectively are fed back to the input terminals of the amplifiers 31a and 31b, respectively via the resistors Rpf and Rnf, respectively.

The output voltages Voutp and Voutn output from the amplifiers 31a and 31b, respectively are applied to both ends of the series circuits of the resistors R11 and R12, and the common-mode signal Vcm corresponding to the common-mode components of the output voltages Voutp and Voutn is input to the positive-side input terminal of the amplifier P31 via the connection point between the resistors R11 and R12. When the common-mode signal Vcm is input to the positive-side input terminal of the amplifier P31, the amplifier P31 amplifies a difference between the common-mode signal Vcm and the reference potential Vrefcm, and outputs the signal Vcmc obtained by amplifying the difference between the common-mode signal Vcm and the reference potential Vrefcm. The signal Vcmc output from the amplifier P31 is fed back to the input terminals of the amplifiers 11a and 11b via the resistors R31 and R32, respectively. The output voltages Voutp and Voutn output from the amplifiers 31a and 31b, respectively are output as the output voltages Von and Vop of the amplifier circuit.

The common-mode voltage Voutcm and the differential voltage Voutdm of the output voltages Voutp and Voutn output from the amplifiers 31a and 31b, respectively can be calculated as follows.

To calculate the common-mode voltage Voutcm and the differential voltage Voutdm, the following assumption is made.

$$Rni=Rpi=Ri$$

$$Rnf=Rpf=Rf$$

$$Rnc=Rpc=Rc$$

In the above equations, Rpi, Rni, Rpf, and Rnf represent resistances of the resistors Rpi, Rni, Rpf, and Rnf, respectively, and Rnc and Rpc represent resistances of the resistors R32 and R31, respectively.

A common-mode voltage of the input voltages Vainp and Vainn is defined as Vaincm=(Vainp+Vainn)/2, and a differential voltage of the input voltages Vainp and Vainn is defined as Vaindm=(Vainp-Vainn)/2.

The input voltages Vainp and Vainn of the differential amplifier Z21 can be regarded as the same constant values when a mismatch of element characteristics is disregarded and also when gains of the amplifiers 31a and 31b are assumed to be sufficiently large. Therefore, Vinp=Vinn=Vin is established.

When the Kirchhoff's current law is applied in the nodes P and N, the following relationship is established.

$$(Vainp-Vin)/Ri+(Von-Vin)/Rf+(Vcmc-Vin)/Rc=0$$

$$(Vainn-Vin)/Ri+(Vop-Vin)/Rf+(Vcmc-Vin)/Rc=0$$

The output voltages Von and Vop are obtained from the following equations.

$$Von=-Rf/Ri\times Vainp+(Rf+Ri)/Ri\times Vin+Rf/Rc\times (Vcmc-Vin)$$

$$Vop=-Rf/Ri\times Vainn+(Rf+Ri)/Ri\times Vin+Rf/Rc\times (Vcmc-Vin)$$

As a result, the common-mode voltage Voutcm and the differential voltage Voutdm can be given by the following equations (2-1) and (2-2).

$$Voutcm=-Rf/Ri\times Vaincm+(Rf+Ri)/Ri\times Vin+Rf/Rc\times (Vcmc-Vin) \qquad \text{Equation (2-1)}$$

$$Voutdm=-Rf/Ri\times Vaindm \qquad \text{Equation (2-2)}$$

From the equation (2-2), it is clear that the differential voltage Voutdm of the output of the differential amplifier Z11 is equal to a multiplication of a resistance ratio of a main resistor to the input differential voltage Vaindm.

From the equation (2-1), the common-mode voltage Voutcm of the output of the differential amplifier Z21 is expressed as a sum of multiplication of a predetermined resistance ratio to each of (1) the input common-mode voltage of the differential amplifier Z21 (a first term), (2) the input voltage of the differential amplifier Z21 (a second term), and (3) a difference between the output voltage of the control circuit 15b and the input voltage of the differential amplifier Z21 (a third term), respectively.

A value of the first term and a value of the second term of the equation (2-1) cannot be controlled by the differential amplifier Z21. However, out of the third term of the equation (2-1), only Vcmc is in a negative feedback loop of the differential amplifier Z21, and is negative feedback controlled. Therefore, the common-mode voltage Voutcm can be controlled to a desired value without giving influence to the differential voltage Voutdm. When a proper ratio is applied to the values of Rf and Ri, for example, a value of Voutcm can be set to a predetermined value regardless of a value of Vaincm, and thus there is no limitation of an adjustment range of the output common-mode voltage in principle.

In the above embodiments, while a method of applying the differential amplifier shown in FIG. 1 to the sample-and-hold circuit shown in FIG. 6 or to the amplifier circuit shown in FIG. 8 has been explained as an example, the present invention is not limited thereto, and can be also applied to other circuits.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A differential amplifier comprising;
a first amplifier which is provided with a first input terminal;
a second amplifier which is provided with a second input terminal; and
a common-mode feedback circuit that feeds back signal corresponding to common-mode components of output terminal voltage of the first and second amplifiers to the first and the second input terminals via first and second passive elements connected to a common terminal, respectively, wherein the common-mode feedback circuit comprises:
a common-mode detection circuit that detects common mode components of the output terminal voltage of the first and second amplifiers, and
a control circuit that outputs to the common terminal a control signal generated based on common-mode components detected by the common-mode detection circuit, and outputs the control signal from the common terminal to the input terminals of the first and second amplifiers via the first and second passive elements, respectively, wherein the common-mode detection circuit comprises:
a first resistor connected between the output terminal of the first amplifier and the output terminal of the common-mode detection circuit,
a second resistor connected between the output terminal of the second amplifier and the output terminal of the common-mode detection circuit,
a first buffer inserted between the output terminal of the first amplifier and the first resistor, and
a second buffer inserted between the output terminal of the second amplifier and the second resistor.

2. A differential amplifier, comprising:
a first amplifier which is provided with a first input terminal;
a second amplifier which is provided with a second input terminal; and
a common-mode feedback circuit that feeds back signal corresponding to common-mode components of output terminal voltage of the first and second amplifiers to the first and the second input terminals via first and second passive elements connected to a common terminal, respectively; wherein the common-mode feedback circuit comprises:
a common-mode detection circuit that detects common mode components of the output terminal voltage of the first and second amplifiers, and
a control circuit that outputs to the common terminal a control signal generated based on common-mode components detected by the common-mode detection circuit, and outputs the control signal from the common terminal to the input terminals of the first and second amplifiers via the first and second passive elements, respectively, wherein the common mode detection circuit comprises:
a first capacitor having one end thereof connected to the output terminal of the common-mode detection circuit,
a second capacitor having one end thereof connected to the output terminal of the common-mode detection circuit,
a first switch connected between the other end of the first capacitor and the output terminal of the first amplifier,
a second switch connected between the other end of the second capacitor and the output terminal of the second amplifier,
a third switch connected between the other end of the first capacitor and a reference potential,
a fourth switch connected between the other end of the second capacitor and the reference potential,
a fifth switch connected between the output terminal of the common-mode detection circuit and the reference potential,
the third switch, the fourth switch, and the fifth switch are turned on and off according to a first pulse signal, and
the first switch and the second switch are turned on and off according to a second pulse signal.

3. The differential amplifier according to claim 2, wherein the first pulse signal and the second pulse signal have their levels inverted to each other.

4. The differential amplifier according to claim 3, wherein a dead time is provided between the first pulse signal and the second pulse signal.

5. A differential amplifier, comprising:
a first amplifier which is provided with a first input terminal;
a second amplifier which is provided with a second input terminal; and
a common-mode feedback circuit that feeds back signal corresponding to common-mode components of output terminal voltage of the first and second amplifiers to the first and the second input terminals via first and second passive elements connected to a common terminal, respectively, wherein the common-mode feedback circuit comprises:
a common-mode detection circuit that detects common mode components of the output terminal voltage of the first and second amplifiers, and
a control circuit that outputs to the common terminal a control signal generated based on common-mode components detected by the common-mode detection circuit, and outputs the control signal from the common terminal to the input terminals of the first and second amplifiers via the first and second passive elements, respectively, wherein the control circuit comprises:
a first capacitor used as the first passive element,
a second capacitor used as the second passive element,
a third amplifier that amplifies a signal of the output terminal of the common-mode detection circuit, and outputs the amplified signal to the common terminal,
a first switch connected between a first reference potential and the common terminal,
a second switch connected between an output terminal of the third amplifier and the common terminal,
a third switch connected between the input terminal of the first amplifier and a second reference potential,
a fourth switch connected between the input terminal of the second amplifier and the second reference potential, the first switch, the third switch, and the fourth switch are turned on and off according to a first pulse signal, and the second switch is turned on and off according to a second pulse signal.

6. The differential amplifier according to claim 5, wherein the first pulse signal and the second pulse signal have their levels inverted to each other.

7. The differential amplifier according to claim 6, wherein a dead time is provided between the first pulse signal and the second pulse signal.

* * * * *